(12) United States Patent
Jang et al.

(10) Patent No.: US 10,678,360 B2
(45) Date of Patent: Jun. 9, 2020

(54) PASSIVE MATRIX ORGANIC LIGHT EMITTING DIODE DISPLAY AND METHOD OF CONTROLLING THE SAME

(71) Applicant: Solomon Systech (Shenzhen) Limited, Shenzhen (CN)

(72) Inventors: Hong Jae Jang, Seoul (KR); Hyung-Cheol Shin, Daejeon (KR); Il-Hyun Yun, Daejeon (KR)

(73) Assignee: Solomon Systech (Shenzhen) Limited, Shenzhen (CN)

( * ) Notice: Subject to any disclaimer, the term of this patent is extended or adjusted under 35 U.S.C. 154(b) by 0 days.

(21) Appl. No.: 16/143,435

(22) Filed: Sep. 26, 2018

(65) Prior Publication Data
US 2019/0102023 A1    Apr. 4, 2019

(30) Foreign Application Priority Data

Sep. 29, 2017    (KR) ........................ 10-2017-0127443

(51) Int. Cl.
*G09G 3/3216*    (2016.01)
*H01L 27/32*    (2006.01)
(Continued)

(52) U.S. Cl.
CPC ............ *G06F 3/0412* (2013.01); *G06F 3/044* (2013.01); *G06F 3/0416* (2013.01);
(Continued)

(58) Field of Classification Search
CPC ...... G06F 3/0412; G06F 3/0416; G06F 3/044; G06F 3/04166; G06F 3/041; G06F 3/03;
(Continued)

(56) References Cited

U.S. PATENT DOCUMENTS

| | | | | |
|---|---|---|---|---|
| 2012/0098776 A1* | 4/2012 | Chen | ..................... | G06F 3/0416 345/173 |
| 2014/0225838 A1* | 8/2014 | Gupta | .................. | G06F 3/0412 345/173 |
| 2016/0378224 A1* | 12/2016 | Kwon | ................. | H01L 51/5256 345/174 |

FOREIGN PATENT DOCUMENTS

| | | | | |
|---|---|---|---|---|
| JP | 2012532389 A | 12/2012 | | |
| JP | 2014-030599 A1 * | 7/2016 | ............ | G06F 3/044 |
| KR | 1020150106920 A | 9/2015 | | |

OTHER PUBLICATIONS

Office Action issued in corresponding Korean patent application No. 1020170127443 dated May 23, 2019.

* cited by examiner

*Primary Examiner* — Julie Anne Watko
(74) *Attorney, Agent, or Firm* — Idea Intellectual Limited; Margaret A. Burke; Sam T. Yip

(57) ABSTRACT

A method of controlling a PMOLED display, which includes a plurality of lower electrode patterns arranged in parallel, a plurality of transparent electrode patterns arranged in parallel and being perpendicular to the lower electrode patterns, and an organic compound layer interposed between lower electrode patterns and transparent electrode patterns, to perform a display output and touch sensing by time-sharing a control period for the lower electrode patterns and the transparent electrode patterns into a display control period and a touch-sensor control period in every display frame time, including providing a driving node formed on a line for communication between the transparent electrode patterns and a display driving circuit and a touch sensing unit connecting the driving node and a touch sensing circuit; performing the display output by connecting the transparent electrode patterns and the display driving circuit in the display control period; and performing the touch sensing by (Continued)

connecting the transparent electrode patterns and the touch sensing circuit by the touch sensing unit in the touch-sensor control period.

8 Claims, 5 Drawing Sheets

(51) Int. Cl.
*G06F 3/044* (2006.01)
*G06F 3/041* (2006.01)

(52) U.S. Cl.
CPC ....... *G06F 3/04166* (2019.05); *G09G 3/3216* (2013.01); *H01L 27/323* (2013.01); *H01L 27/3281* (2013.01); *G09G 2300/0426* (2013.01); *G09G 2300/06* (2013.01); *G09G 2354/00* (2013.01)

(58) Field of Classification Search
CPC ........... G06F 3/01; G06F 3/00; G09G 3/3216; G09G 2300/0426; G09G 2300/06; G09G 2354/00; G09G 3/3208; G09G 3/32; G09G 3/30; G09G 3/22; G09G 3/20; G09G 3/00; G09G 2300/0421; G09G 2300/04; G09G 2300/00; H01L 27/323; H01L 27/3281; H01L 27/3241; H01L 27/32; H01L 27/28; H01L 27/00; H01L 27/3225

See application file for complete search history.

PASSIVE MATRIX ORGANIC LIGHT EMITTING DIODE DISPLAY AND METHOD OF CONTROLLING THE SAME

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS-REFERENCE TO RELATED APPLICATION

The present invention claims priority to Korean Patent Application No. 10-2017-0127443 filed Sep. 29, 2017, the disclosure of which is incorporated by reference herein.

FIELD OF THE INVENTION

The present invention relates to a display using a passive matrix organic light emitting diode (PMOLED) among organic light emitting diodes and more particularly, to a PMOLED display capable of implementing a touch by an in-cell structure in the PMOLED.

BACKGROUND

Since an organic light emitting diode directly emits light from an emission layer positioned between a cathode and an anode, there is an advantage in that a backlight is not required, an expression range of light is wider than that of a Liquid Crystal Display (LCD), and a black level is excellent. That is, in the organic light emitting diode, when a voltage is applied to the cathode and the anode, electrons and holes are injected into each electrode and the injected electrons and holes pass through an electron transport layer and a hole transport layer, respectively, to be coupled to each other in the emission layer.

A light emitting material of the emission layer is excited by energy due to the coupling and the light is generated when the light emitting material returns from the excited state to a ground state again. The light generated when the light emitting material returns from the excited state (singlet state) to the ground state as it is fluorescence, and the light used when the light emitting material returns from the singlet state to the ground state via a triplet state having a slight low energy level is phosphorescence. In spite of the excited state, energy that is not properly used with the light may be inactivated without being emitted.

In the organic light emitting diode, as the cathode, a metal thin film such as aluminum and silver/magnesium alloys, calcium, and the like, and as the anode, a transparent metal thin film such as indium tin oxide called ITO may be used. An organic compound layer formed between the cathode and the anode may include a hole injection layer (HIL), a hole transport layer (HTL), an emission layer (EML), an electron transport layer (ETL), and an electron injection layer (EIL). When a driving voltage is applied between the cathode and the anode, the holes passing through the HTL and the electrons passing through the ETL are moved to the EML to form excitons, and as a result, the EML generates visible light. The generated light is reflected on a reflective surface and transmits a transparent electrode and a substrate (a glass plate, a plastic plate, or the like).

The organic light emitting diode may be classified into a passive matrix organic light emitting diode (PMOLED) and an active matrix organic light emitting diode (AMOLED) according to a control mode thereof.

The PMOLED has a structure in which a voltage is applied to each of a horizontal axis and a vertical axis of a light emitting element which is disposed on a screen, respectively, to illuminate a cross point thereof, and thus, the structure is relatively simple and production cost is low, but there is a disadvantage in that a delicate screen cannot be implemented. The AMOLED is intended to overcome the disadvantage of the PMOLED and has an advantage that a thin film transistor (TFT) is embedded for each light emitting element to control whether each element emits the light, respectively, and recently, since a screen size thereof may be applied to a large device, an application range thereof is widened.

In Korean Patent Registration No. 10-1170806, a device for a passive matrix is described, but particularly, a method for implementing a touch function in the PMOLED is not described.

BRIEF SUMMARY

An object of the present invention is to provide a PMOLED display capable of implementing a touch function by an in-cell type in a PMOLED.

Another object of the present invention is to provide a PMOLED display capable of removing an effect of a residual capacitance in implementing a touch function in a PMOLED.

Yet another object of the present invention is to provide a PMOLED display having an improved structure in order to implement a touch function in a PMOLED.

According to an exemplary embodiment of the present invention to achieve the objects of the present invention, there is disclosed a method of controlling a PMOLED display, which includes a plurality of bottom electrode patterns arranged in parallel, a plurality of transparent electrode patterns arranged in parallel and being perpendicular to the bottom electrode patterns, and an organic compound layer interposed between the bottom electrode patterns and the transparent electrode patterns, to perform a display output and a touch sensing by time-sharing a control period for the bottom electrode patterns and the transparent electrode patterns into a display control period and a touch-sensor control period in every display frame time, the method comprising the steps of: providing a driving node which is formed on a line for communication between the transparent electrode patterns and a display driving circuit, and a touch sensing unit connecting the driving node and a touch sensing circuit; performing the display output by connecting the transparent electrode patterns and the display driving circuit in the display control period; and performing the touch sensing by connecting the transparent electrode patterns and the touch sensing circuit by the touch sensing unit in the touch-sensor control period.

The driving node are provided between the transparent electrode patterns connected with the display driving circuit and the touch sensing circuit is connected to the driving node by the touch sensing unit. In order to implement the display output and the touch sensing in one display, the display frame time may be time-shared into a display control period and a touch-sensor control period, and in each control period, the display output and the touch sensing may be alternately performed.

In the case of the PMOLED, due to a residual capacitance between the transparent electrode patterns and the bottom electrode patterns, the touch sensing may not be smooth. As a result, in the exemplary embodiment, in the touch sensing, a pulse type driving voltage may be supplied to the transparent electrode patterns and the bottom electrode patterns or the transparent electrode patterns and the bottom electrode patterns may be floated. In addition, a signal is synchronized between the transparent electrode patterns and the bottom electrode patterns regardless of the presence or absence of the residual capacitance to easily sense a change in constant voltage or capacitance due to an external touch.

In the exemplary embodiment, a touch reference voltage may be uniformly supplied to all the bottom electrode patterns before the touch-sensor control period and a display reference voltage may be uniformly supplied to all the bottom electrode patterns before the display control period. This is because a voltage set value for the touch sensing and a voltage set value for the display output may be different from each other. In the touch-sensor control period, the pulse type driving voltage may be applied in addition to the touch reference voltage.

The display reference voltage may be set to be higher than the touch reference voltage, and the touch reference voltage may be set in a range of about −3 V or more and about 3 V or less and the display reference voltage may be set in a range of about 5 V or more and about 20 V or less.

In the case of the display output, each transparent electrode pattern may function as each independent segment electrode (SEG) or anode. However, in the case of the touch sensing, the transparent electrode patterns may not function separately. Generally, in the case of the display using the PMOLED, a high resolution is not required and, in many cases, a small screen is constituted. Accordingly, the touch sensing may also be required only when being recognized as a simple operation, not the high resolution.

To this end, two or more transparent electrode patterns form groups, and in the touch-sensor control period, the transparent electrode patterns forming the groups are connected into one by the touch sensing unit to function just like a single touch sensor.

To this end, a plurality of driving nodes adjacent to each other may be connected with one touch sensing unit, and in this case, the plurality of transparent electrode patterns may be grouped and connected with the touch sensing circuit by the touch sensing unit using a switching circuit or the like.

According to another exemplary embodiment of the present invention to achieve the objects of the present invention, there is disclosed a PMOLED display, which includes a plurality of bottom electrode patterns arranged in parallel, a plurality of transparent electrode patterns arranged in parallel and being perpendicular to the bottom electrode patterns, and an organic compound layer interposed between the bottom electrode patterns and the transparent electrode patterns, to perform a display output and a touch sensing by time-sharing a control period for the bottom electrode patterns and the transparent electrode patterns into a display control period and a touch-sensor control period in every display frame time, the PMOLED display comprising: a driving node which is formed on a line for communication between the transparent electrode patterns and a display driving circuit; and a touch sensing unit connecting the driving node and a touch sensing circuit, in which the display output is performed by connecting the transparent electrode patterns and the display driving circuit in the display control period and the touch sensing is performed by connecting the transparent electrode patterns and the touch sensing circuit by the touch sensing unit in the touch-sensor control period.

According to the PMOLED display and the method of controlling the same of the present invention, it is possible to implement a touch function by an in-cell type in the PMOLED and effectively remove an effect of a residual capacitance in implementing the touch function in the PMOLED.

Further, since it is difficult to implement the touch function in the PMOLED, it is not easy to implement the touch function in an execution condition for the display output of the PMOLED. However, in the PMOLED display and the method of controlling the same of the present invention, a condition for the touch sensing may be satisfied while the condition for the display output of the PMOLED is satisfied.

DETAILED DESCRIPTION

Figure 1:
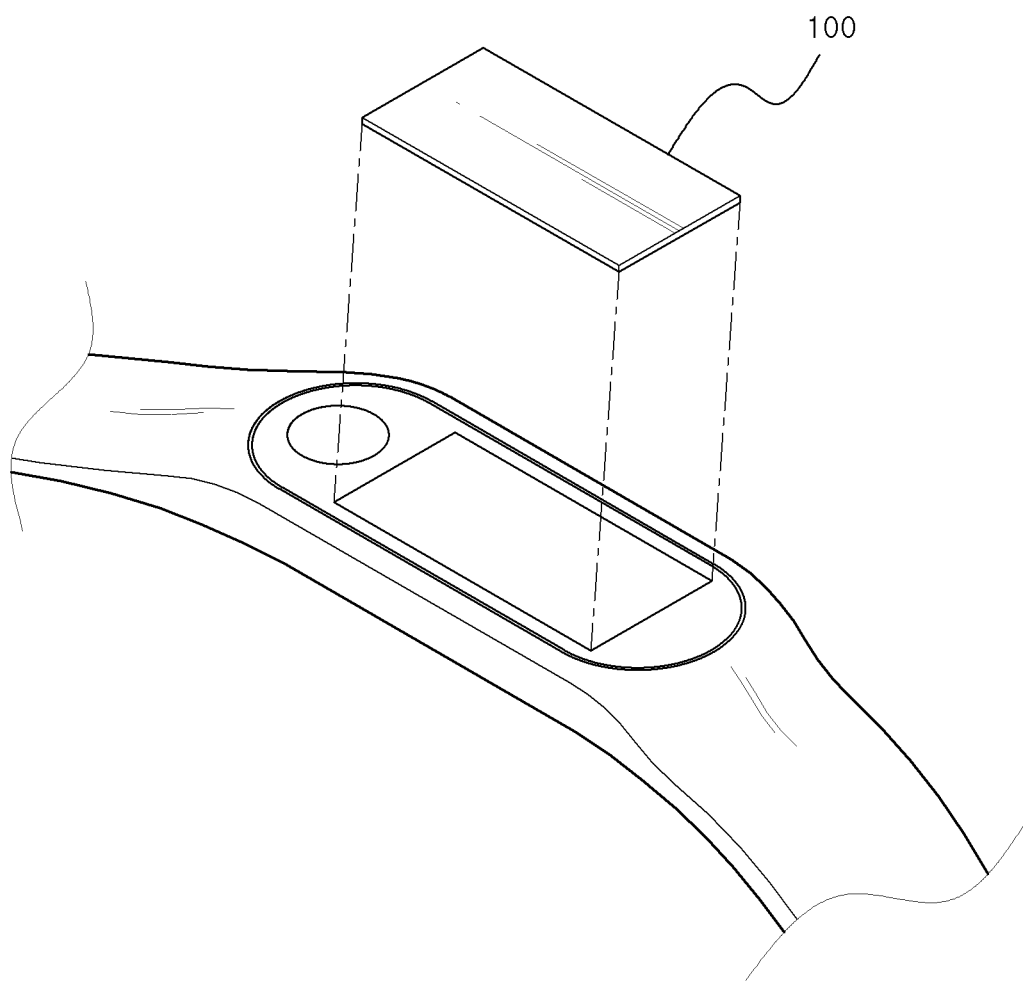
FIG. 1 is a perspective view for describing a use example of a PMOLED display according to an exemplary embodiment of the present invention.

Hereinafter, preferred exemplary embodiments of the present invention will be described in detail with reference to the accompanying drawings, but the present invention is not restricted or limited by the exemplary embodiments. For reference, in this specification, like reference numerals designate substantially like elements. Under such a rule, contents described in other drawings may be cited and described and contents that are determined obviously to those skilled in the art or repeated may be omitted.

Figure 2:
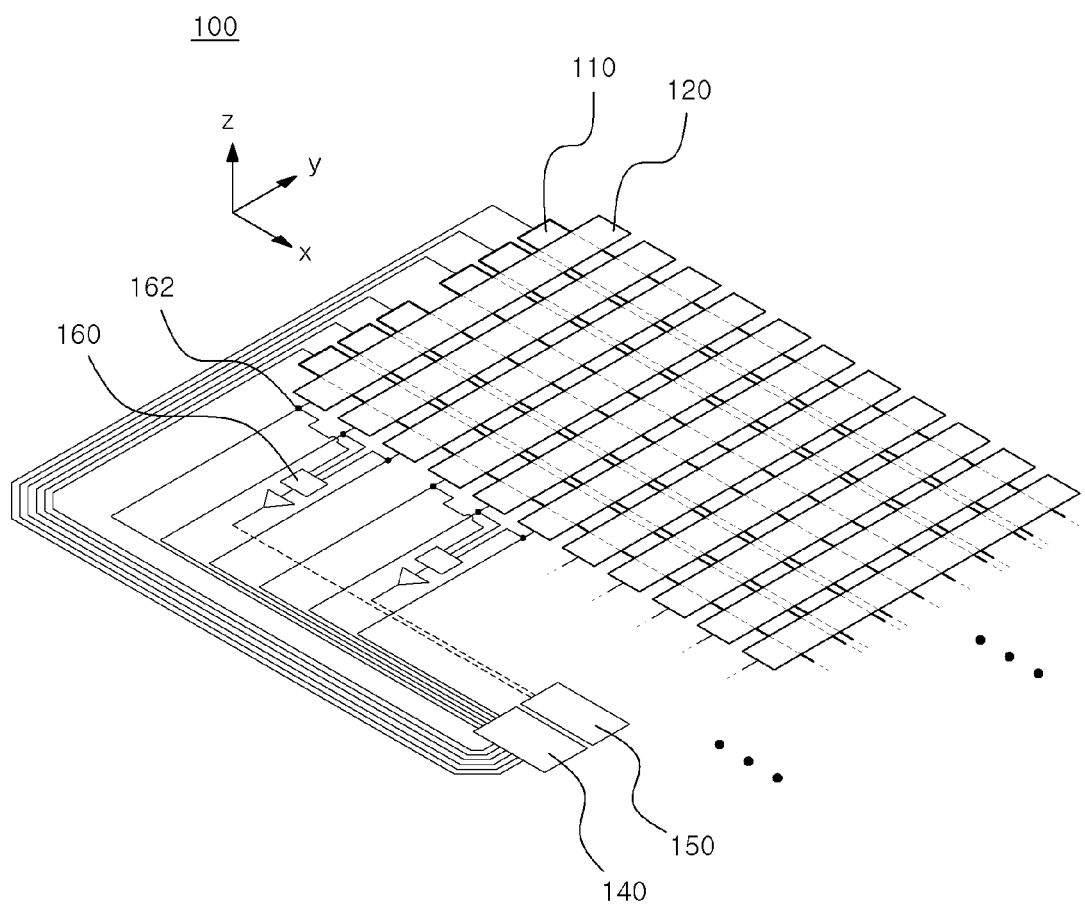
FIG. 2 is a perspective view for describing an electrode pattern structure of the PMOLED display according to the exemplary embodiment of the present invention.
Figure 3:
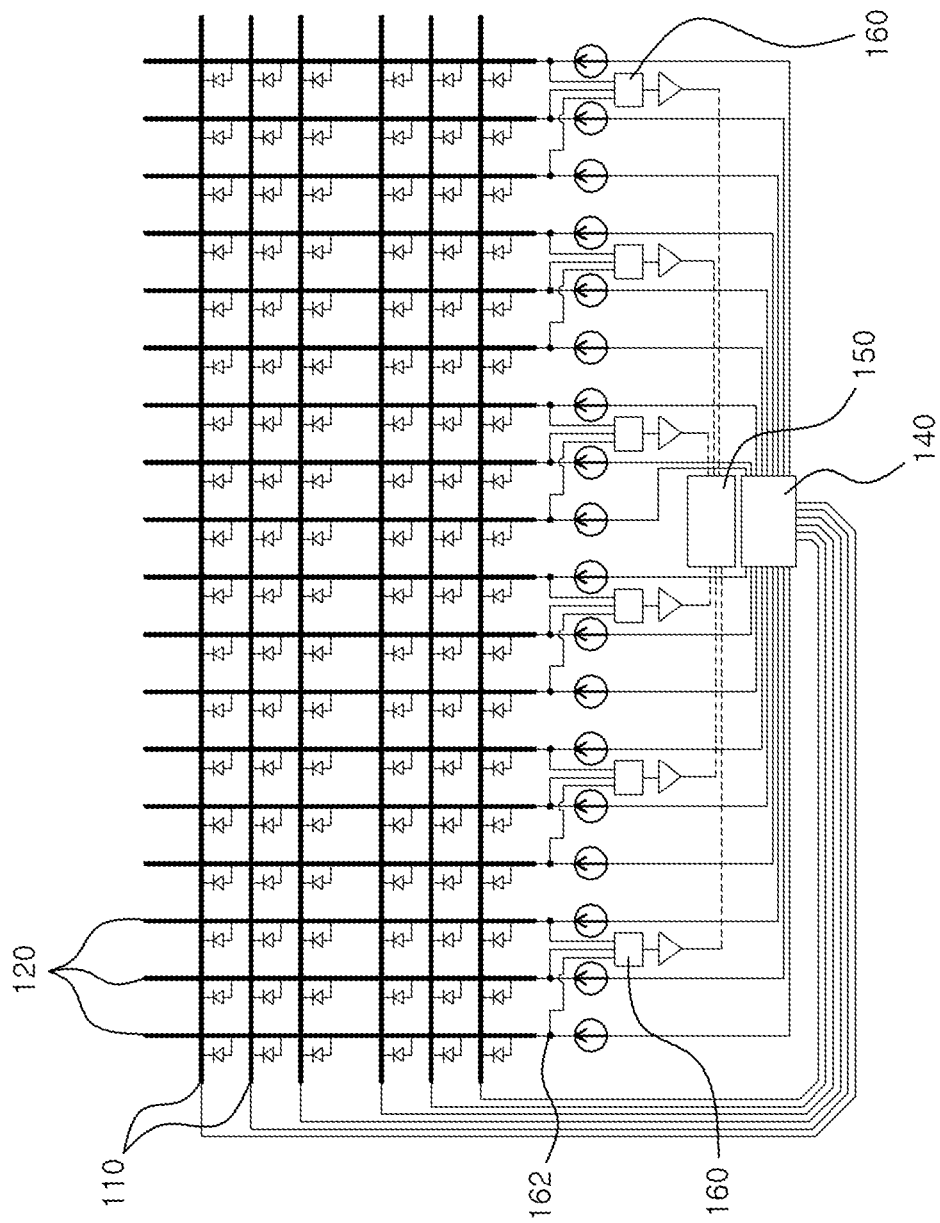
FIG. 3 is a structural view for describing a circuit structure of the PMOLED display of FIG. 2.

FIG. 1 is a perspective view for describing a use example of a PMOLED display according to an exemplary embodiment of the present invention, FIG. 2 is a perspective view for describing an electrode pattern structure of the PMOLED display according to the exemplary embodiment of the present invention, and FIG. 3 is a structural view for describing a circuit structure of the PMOLED display of FIG. 2.

Referring to FIGS. 1 to 3, a PMOLED display 100 according to an exemplary embodiment of the present invention includes a plurality of bottom electrode patterns 110 arranged in parallel, a plurality of transparent electrode patterns 120 arranged in parallel and being perpendicular to the bottom electrode patterns 110, and an organic compound layer interposed between the bottom electrode patterns 110 and the transparent electrode patterns 120. The transparent electrode patterns 120 and the bottom electrode patterns 110 are connected to a display driving circuit 140, and a desired image or character may be displayed on the PMOLED display 100 for each pixel by the control of the display driving circuit 140.

Figure 5:
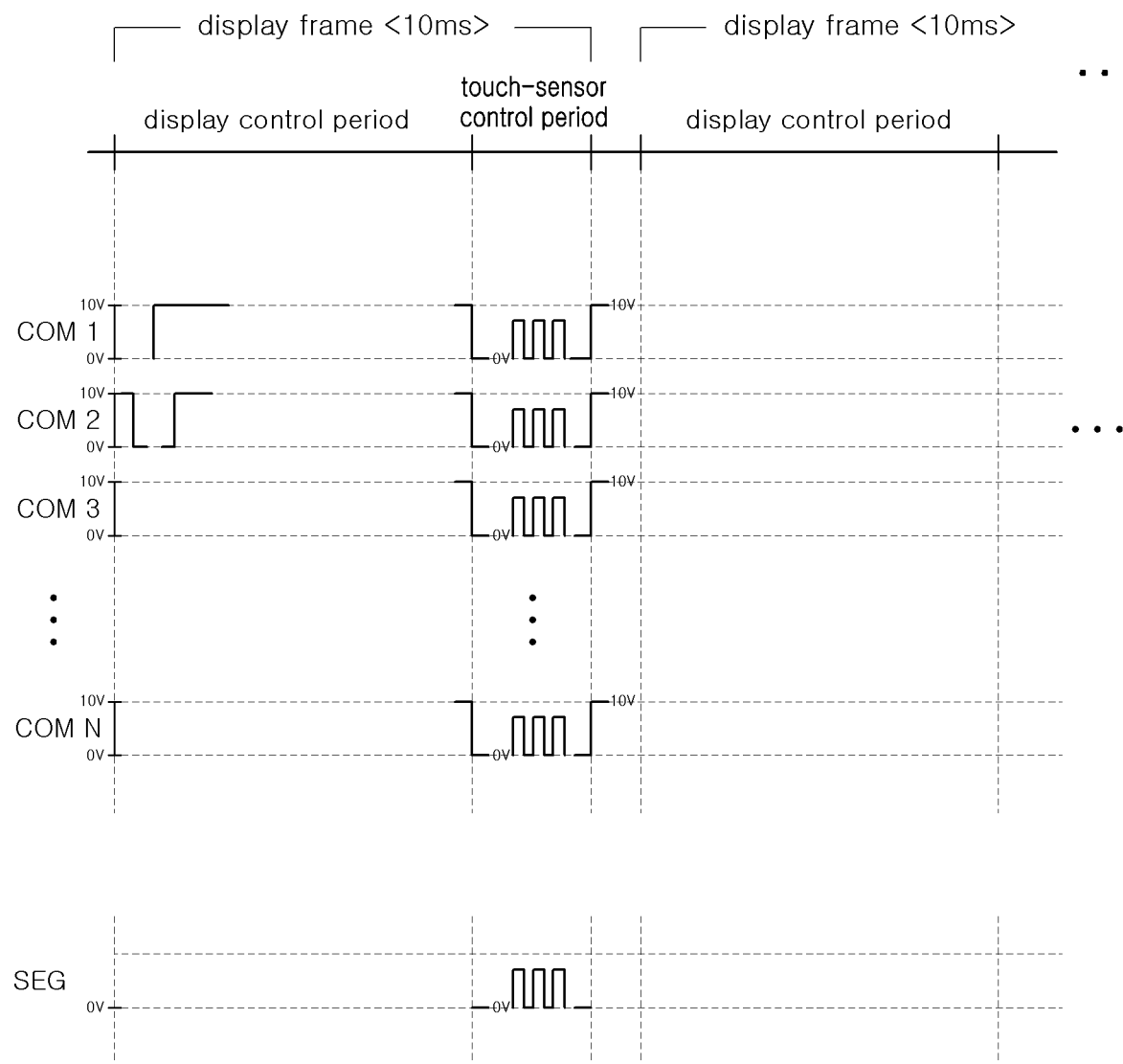
FIG. 5 is a diagram for describing a process of controlling bottom electrode patterns in a time-sharing state in every display frame time in the PMOLED display according to the exemplary embodiment of the present invention.

As illustrated in FIG. 5 to be described, the PMOLED display 100 according to the exemplary embodiment time-shares a control period of the transparent electrode patterns 120 and the bottom electrode patterns 110 into a display control period and a touch-sensor control period in every display frame time to perform a display output and a touch sensing at different times and alternately perform the display output and the touch sensing.

According to the exemplary embodiment, the PMOLED display 100 further includes a touch sensing circuit 150 in addition to the display driving circuit 140. The display driving circuit 140 and the touch sensing circuit 150 are functionally separated from each other, but may be formed together in one integrated circuit (IC), and like the exemplary embodiment, may also be functionally separated from each other.

However, a separate touch sensor is not used for the touch sensing and in the PMOLED display 100 according to the exemplary embodiment, the transparent electrode patterns 120 disposed relatively above may be used as the touch sensor. To this end, a driving node 162 is formed on a line for communication between the transparent electrode patterns 120 and the display driving circuit 140, and the touch sensing circuit 150 and the transparent electrode patterns 120 may be electrically connected to each other through the driving node 162. Further, a touch sensing unit 160 may be provided between the driving node 162 and the touch sensing circuit 150. The touch sensing unit 160 may perform a kind of switch function capable of selectively connecting the transparent electrode patterns 120 and the touch sensing circuit 150 and implement the touch sensing by electrically connecting the transparent electrode patterns 120 and the touch sensing circuit 150 only in the aforementioned touch-sensor control period. The touch sensing unit 160 may also be provided as a separate component; however, it may also be included together the IC formed with the touch sensing circuit 150.

Functionally, in the display control period, the display driving circuit 140 controls the transparent electrode patterns 120 and the bottom electrode patterns 110 for the display output, and in the touch-sensor control period, the touch sensing circuit 150 may control the transparent electrode patterns 120 and the bottom electrode patterns 110 for the touch sensing.

According to the exemplary embodiment, in the PMOLED display 100, since the transparent electrode patterns 120 and the bottom electrode patterns 110 are formed over a relatively large area, the transparent electrode patterns 120 and the bottom electrode patterns 110 may be largely influenced by the residual capacitance therebetween and such a residual capacitance adversely affects a Signal-to-Noise Ratio (SNR) in the touch sensing, thereby making it impossible to sense a change in constant voltage or a change in capacitance by a finger contact.

Figure 4:
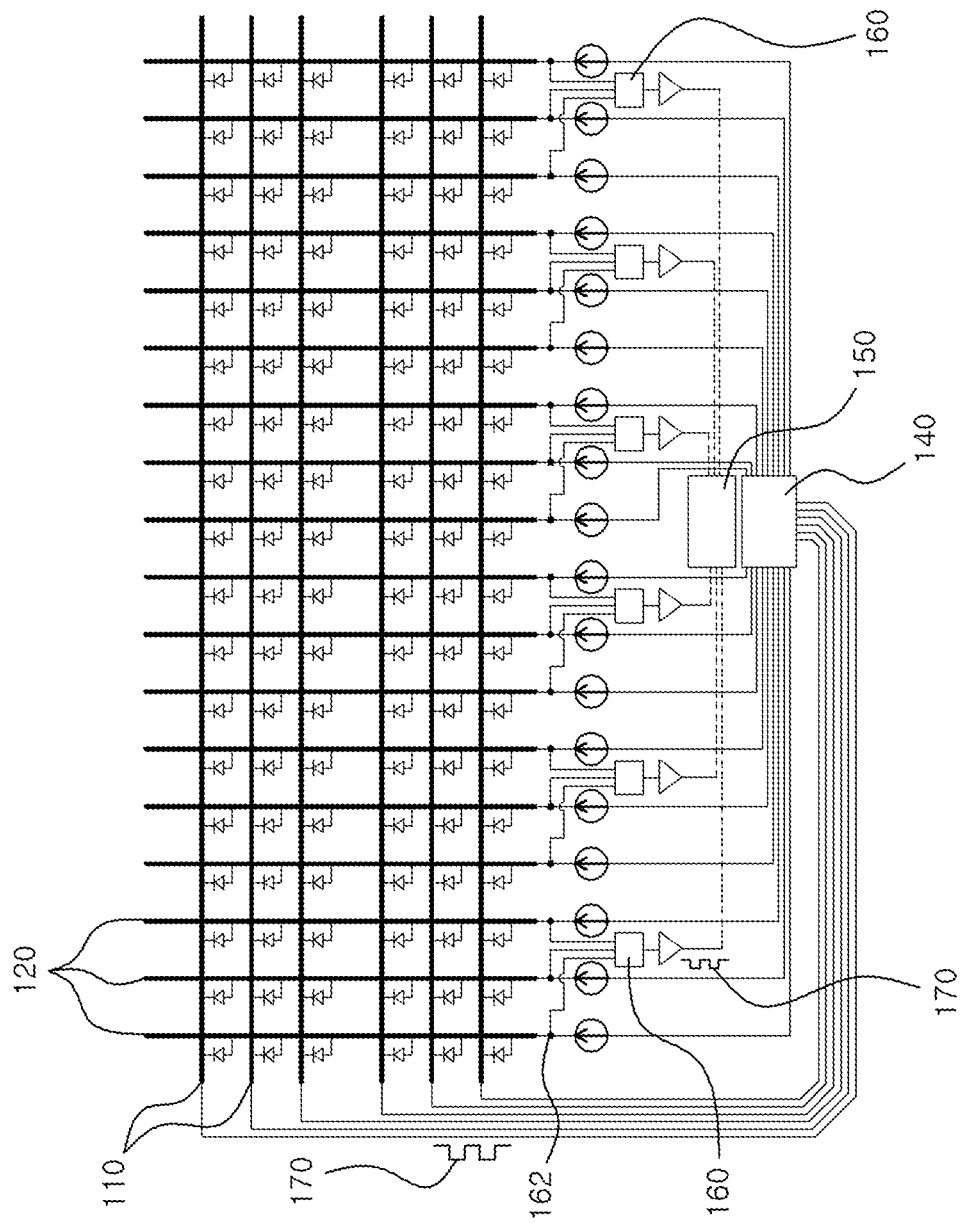
FIG. 4 is a diagram for describing a process of supplying a driving voltage for touch sensing in the PMOLED display according to the exemplary embodiment of the present invention.

FIG. 4 is a diagram for describing a process of supplying a driving voltage for touch sensing in the PMOLED display according to the exemplary embodiment of the present invention and FIG. 5 is a diagram for describing a process of controlling bottom electrode patterns in a time-sharing state in every display frame time in the PMOLED display according to the exemplary embodiment of the present invention.

Referring to FIG. 4, in the touch sensing, a pulse type driving voltage 170 may be provided to the transparent electrode patterns 120 and the bottom electrode patterns 110. The voltage is synchronized and changed in the transparent electrode patterns 120 and the bottom electrode patterns 110 by the driving voltage 170, and the change in constant voltage or capacitance due to an external touch may be easily sensed between the transparent electrode patterns 120 and the bottom electrode patterns 110 regardless of the presence or absence of the residual capacitance. In addition, it is also possible to float the transparent electrode patterns and the bottom electrode patterns.

Referring to FIG. 5, in the display control period, a voltage of about 10 V may be generated in the bottom electrode patterns 110, and in the case, even though the pulse type driving voltage is supplied to the transparent electrode patterns 120 and the bottom electrode patterns 110, the touch sensing may not be smooth.

To solve the problem, in the exemplary embodiment, a touch reference voltage of about −3 V or more and 3 V or less may be uniformly supplied to all the bottom electrode patterns 110. The bottom electrode patterns 110 are maintained at a relatively low voltage and thus, the touch sensing using the transparent electrode patterns 120 may be smooth.

As illustrated in the drawings, in the touch-sensor control period, the pulse type driving voltage may be applied in addition to the touch reference voltage, and a pulse having the same waveform may be supplied to the transparent electrode patterns (SEG) 120 and the bottom electrode patterns (COM) 110.

However, when the touch-sensor control period ends, before the display control period, a display reference voltage of about 5 V or more and 20 V or less may be uniformly supplied to all the bottom electrode patterns 110. As an example, the display reference voltage of about 10 V is supplied to all the bottom electrode patterns 110 to reset pixels for the display, thereby entirely maintaining an initial state in which the organic light emitting diode is not emitted.

As described above, it is preferred that the display reference voltage is set to be higher than the touch reference voltage, and particularly, the touch reference voltage may be set to have a predetermined value in the range of about −3 V or more and about 3 V or less and the display reference voltage may be set to have a predetermined value in the range of about 5 V or more and about 20 V or less.

Referring back to FIGS. 2 and 3, three transparent electrode patterns 120 may be grouped by one touch sensing unit 160. In the case of the display output, each transparent electrode pattern 120 may function as each independent segment electrode (SEG) or anode. However, in the case of the touch sensing, the transparent electrode patterns 120 are partially grouped without using each independent touch sensor to sense a body contact.

Generally, in the case of the display using the PMOLED, a high resolution is not required and, in many cases, a small screen is constituted. Accordingly, the touch sensing may also be required only when being recognized as a simple operation, not the high resolution. For example, it may be sufficient to sense whether a simple touch is present, a division of left and right, and only an operation of scrolling up or down.

To this end, even if the number is not three, two or more transparent electrode patterns 120 form groups, and in the touch-sensor control period, the transparent electrode patterns 120 forming the groups are connected into one by the touch sensing unit 160 to function just like a single touch sensor.

To this end, a plurality of driving nodes 162 adjacent to each other may be interconnected with one touch sensing unit 160, and the plurality of transparent electrode patterns 120 may be commonly connected with the touch sensing circuit as a group by the touch sensing unit 160 using a switching circuit or the like. As a result, there is an advantage in that the number of lines for the touch sensing may be reduced and circuit formation and the like may be facilitated.

As described above, although the present invention has been described with reference to the preferred exemplary embodiments, those skilled in the art will appreciate that various changes and modifications are possible, without departing from the scope and spirit of the present invention as disclosed in the appended claims.

The invention claimed is:

1. A method of controlling a PMOLED display, which includes a plurality of bottom electrode patterns arranged in parallel, a plurality of transparent electrode patterns arranged in parallel and being perpendicular to the bottom electrode patterns, and an organic compound layer interposed between the bottom electrode patterns and the transparent electrode patterns, to perform a display output and a touch sensing by time-sharing a control period for the bottom electrode patterns and the transparent electrode patterns into a display control period and a touch-sensor control period in every display frame time, the method comprising:
   providing a driving node which is formed on a line for communication between the transparent electrode patterns and a display driving circuit, and a touch sensing unit connecting the driving node and a touch sensing circuit;
   performing the display output by connecting the transparent electrode patterns and the display driving circuit in the display control period;
   performing the touch sensing by connecting the transparent electrode patterns and the touch sensing circuit by the touch sensing unit in the touch-sensor control period;
   supplying a touch reference voltage to the bottom electrode patterns before the touch-sensor control period; and
   supplying a display reference voltage to the bottom electrode patterns before the display control period,
   wherein the display reference voltage is set to be higher than the touch reference voltage.

2. The method of claim 1, wherein in the touch sensing, a pulse type driving voltage is supplied to the transparent electrode patterns and the bottom electrode patterns or the transparent electrode patterns and the bottom electrode patterns are floated.

3. The method of claim 1, wherein the touch reference voltage is set in a range of −3 V or more and 3 V or less and the display reference voltage is set in a range of 5 V or more and 20 V or less.

4. The method of claim 1, wherein a plurality of adjacent driving nodes are connected with the touch sensing unit, and in the touch sensing, a plurality of transparent electrode patterns commonly connected to one touch sensing unit are used as a single touch sensor.

5. A PMOLED display, which includes a plurality of bottom electrode patterns arranged in parallel, a plurality of transparent electrode patterns arranged in parallel and being perpendicular to the bottom electrode patterns, and an organic compound layer interposed between the bottom electrode patterns and the transparent electrode patterns, to perform a display output and a touch sensing by time-sharing a control period for the bottom electrode patterns and the transparent electrode patterns into a display control period and a touch-sensor control period in every display frame time, the PMOLED display comprising:
   a driving node which is formed on a line for communication between the transparent electrode patterns and a display driving circuit; and
   a touch sensing unit connecting the driving node and a touch sensing circuit,
   wherein the display output is performed by connecting the transparent electrode patterns and the display driving circuit in the display control period and the touch sensing is performed by connecting the transparent electrode patterns and the touch sensing circuit by the touch sensing unit in the touch-sensor control period; and
   a touch reference voltage is supplied to the bottom electrode patterns before the touch-sensor control period, a display reference voltage is supplied to the bottom electrode patterns before the display control period, and the display reference voltage is set to be higher than the touch reference voltage.

6. The PMOLED display of claim 5, wherein during the touch sensing, a pulse type driving voltage is supplied to the transparent electrode patterns and the bottom electrode patterns or the transparent electrode patterns and the bottom electrode patterns are floated.

7. The PMOLED display of claim 5, wherein the touch reference voltage is set in a range of −3 V or more and 3 V or less and the display reference voltage is set in a range of 5 V or more and 20 V or less.

8. The PMOLED display of claim 5, wherein the plurality of adjacent driving nodes are connected with the touch sensing unit and during the touch sensing, a plurality of transparent electrode patterns commonly connected to the touch sensing unit are used as a single touch sensor.

* * * * *